(12) United States Patent
Kaplan

(10) Patent No.: US 7,057,541 B1
(45) Date of Patent: Jun. 6, 2006

(54) DELTA-SIGMA MODULATOR USING LC RESONATORS

(75) Inventor: Todd Kaplan, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/999,554

(22) Filed: Nov. 29, 2004

(51) Int. Cl.
*H03M 3/00* (2006.01)

(52) U.S. Cl. ............... 341/143; 341/144; 341/155

(58) Field of Classification Search ......... 341/143–144
See application file for complete search history.

(56) References Cited

U.S. PATENT DOCUMENTS

| | | | | |
|---|---|---|---|---|
| 5,027,120 A | * | 6/1991 | Thurston | 341/143 |
| 5,392,039 A | * | 2/1995 | Thurston | 341/143 |
| 5,668,552 A | * | 9/1997 | Thurston | 341/143 |
| 5,858,801 A | * | 1/1999 | Brizzolara | 436/518 |
| 6,693,573 B1 | * | 2/2004 | Linder | 341/143 |
| 6,897,796 B1 | * | 5/2005 | Dias et al. | 341/143 |

OTHER PUBLICATIONS

Cherry, J.A., et al., "On the Design of a Fourth-Order Continuous-Time LC Delta-Sigma Modulator for UHF A/D Conversion," *IEEE Transactions on Circuits and Systems-II: Analog and Digital Signal Processing*, vol. 47, No. 6, pp. 518-530 (Jun. 2000).

Raghavan, G., et al., "Architecture, Design, and Test of Continuous-Time Tunable Intermediate-Frequency Bandpass Delta-Sigma Modulators," *IEEE Journal of Solid-State Circuits*, vol. 36, No. 1, pp. 5-13 (Jan. 2001).

* cited by examiner

*Primary Examiner*—Peguy JeanPierre
*Assistant Examiner*—Khai Nguyen
(74) *Attorney, Agent, or Firm*—Ladas & Parry LLP

(57) ABSTRACT

A bandpass continuous-time delta-sigma modulator. The filters of the modulator are LC resonators directly connected in series. Direct connection of the resonators eliminates the need for active components in the modulator, increases linearity and decreases noise.

18 Claims, 4 Drawing Sheets

DELTA-SIGMA MODULATOR USING LC RESONATORS

BACKGROUND

1. Field

The present disclosure relates to the field of delta-sigma modulators. In particular, it relates to a continuous time bandpass delta-sigma modulator using LC resonators.

2. Related Art

FIG. 1 shows a schematic representation of a prior art continuous-time bandpass delta-sigma modulator, showing an input 10, a first transconductor G0, a first second-order resonator 11, a second transconductor G2, a second second-order resonator 12, and a quantizer 13. The delta-sigma modulator of FIG. 1 is a fourth-order delta-sigma modulator, due to the presence of the two second-order resonators, which provide a fourth-order transfer function. Usually, also a feedback loop is present, comprising circuitry 14, which will not be discussed here in detail, because not relevant to the present disclosure. Additionally, although FIG. 1 shows a single feedback loop, multiple feedback and/or feed-forward loops can also be provided.

In a delta-sigma modulator, the poles of the feed-forward open loop are also the zeros of the noise transfer function NTF, i.e. the transfer function between the quantizer noise n and the output. Thus, four zeros in the noise transfer function NTF can, for example, be obtained by inserting four poles in the corresponding feed-forward loop. For example, in the diagram of FIG. 1, four poles are present in the feed-forward loop, due to the presence of the two second-order resonators 11 and 12.

The delta-sigma modulator shown in FIG. 1 can use either active resonators or passive resonators. Active resonators are disclosed, for example, in G. Raghavan, J. F. Jensen et al, "Architecture, design, and test of continuous-time tunable intermediate-frequency bandpass delta-sigma modulators," IEEE J. Solid-State Circuits, vol. 36, pp. 5–13, January 2001.

Passive resonators, such as LC resonators, are shown in FIG. 2. FIG. 2 is similar to the schematic diagram of FIG. 1 and shows a prior art arrangement taken from J. A. Cherry "On the Design of a Fourth-Order Continuous-Time LC Delta-Sigma Modulator for UHF A/D Conversion", IEEE Transactions on Circuits and Systems—II: Analog and Digital Signal Processing, Vol. 47, No. 6, June 2000.

The arrangement of FIG. 2 shows second-order LC resonators 15 and 16 acting as analog filtering circuits. The first LC resonator 15 has a resonant frequency f1 and the second LC resonator 16 has a resonant frequency f2.

The transfer function for this chain of resonators is found by multiplying each of the elements G0, G1, 15, and 16 in FIG. 2 together, and is shown in Equation (1).

$$H(s) = G_0 \frac{sL_1}{s^2 L_1 C_1 + 1} G_1 \frac{sL_2}{s^2 L_2 C_2 + 1} \quad \text{Equation (1)}$$

The input 10 is usually a voltage analog input. The output of the transconductor G0 is a current signal which is input into the LC resonator 15 and output as a voltage signal 17. Also the second LC resonator 16 has a current input and a voltage output. Therefore, a further transconductor G1 is needed, which converts the voltage signal 17 to a current signal 18. The voltage output 19 of the LC resonator 16 is then input into the analog-to-digital converter or quantizer 11.

The presence of the transconductor G1 introduces noise and distortion in the feed-forward loop. In FIG. 2, n1 and d1 represent noise and distortion terms in G1. These refer back to the input by dividing by the gain to obtain $$n(\text{input}) = \frac{n_1}{G_0} \frac{s^2 L_1 C_1 + 1}{sL_1} \quad \text{Equation (2)}$$

At the resonant frequency $$f_1 = \frac{1}{\sqrt{L_1 C_1}}$$

of the resonator 15, n(input)=0. However, away from this resonance frequency, n(input) is not zero and can affect the performance of the modulator. In particular, if resonator 15 has a resonant frequency f1 and resonator 16 has a resonant frequency $$f_2 = \frac{1}{\sqrt{L_2 C_2}},$$

the noise at f2 is higher than the noise at f1, as shown in FIG. 3, which shows the spectrum of the output signal power. The portion A of the waveform of FIG. 3 shows the noise floor, while portion B shows the desired output signal. In order to obtain the highest signal-to-noise ratio possible, the noise floor should be kept as low as possible.

In particular, for narrowband applications, n(input) is reduced by the gain of the first LC resonator 15 at the desired frequency. However, as the bandwidth increases, to achieve optimal signal-to-noise ratio SNR over a bandwidth, the resonator poles are split apart. As a consequence, the noise of the second, third, etc. resonators is no longer reduces by the same degree because the following resonator poles are located at a different location than the first resonator pole.

SUMMARY

According to a first aspect, a bandpass continuous-time delta-sigma modulator is disclosed, comprising: a transconductor, having a voltage analog input and a current analog output; a filtering arrangement, having a current input comprising, at least in part, the current analog output of the transconductor and a voltage analog output; and a quantizer having an input formed by the voltage analog output of the filtering arrangement, wherein the filtering arrangement comprises a first second-order resonator and a second second-order resonator directly connected in series with the first second-order resonator.

According to a second aspect, a bandpass continuous-time delta-sigma modulator is disclosed, comprising: an input circuit transforming a first analog voltage signal into a first analog current signal; a filtering circuit comprising a first LC resonator and a second LC resonator directly connected with the first LC resonator; and an analog-to-digital converter connected with the filtering circuit, wherein: a second analog current signal is input into the filtering circuit, the second analog current signal being formed, at least in part, by the first analog current signal; and a second analog voltage signal is input into the analog-to-digital converter, the second analog voltage being read out from the filtering circuit.

According to a third aspect, a bandpass continuous-time delta-sigma modulator is disclosed, comprising: a filtering arrangement having a current analog input and a voltage analog output: and a quantizer having an input formed by the voltage analog output of the filtering arrangement, wherein the filtering arrangement comprises three or more second-order resonators, at least two of the three or more second-order resonators being directly connected to each other.

According to a fourth aspect, a method to convert an analog voltage signal to a digital voltage signal is disclosed, comprising: providing a first analog voltage signal; converting the first analog voltage signal to a first analog current signal; adding the first analog current signal to a second analog current signal to form a third analog current signal; providing the third analog current signal to an analog filtering circuit comprising a first LC resonator and a second LC resonator in series with the first LC resonator to generate a second analog voltage signal, wherein an output of the first LC resonator forms an input of the second LC resonator; and quantizing the second analog voltage signal to generate the digital voltage signal.

According to a fifth aspect, a lowpass continuous-time delta-sigma modulator is disclosed, comprising: a transconductor, having a voltage analog input and a current analog output; a filtering arrangement, having a current input comprising, at least in part, the current analog output of the transconductor and a voltage analog output; and a quantizer having an input formed by the voltage analog output of the filtering arrangement, wherein the filtering arrangement comprises at least one second-order resonator directly connected with at least one capacitor.

BRIEF DESCRIPTION OF THE DRAWINGS

The present disclosure will be understood and appreciated more fully from the following detailed description taken in conjunction with the drawings in which.

DETAILED DESCRIPTION

Figure 4:
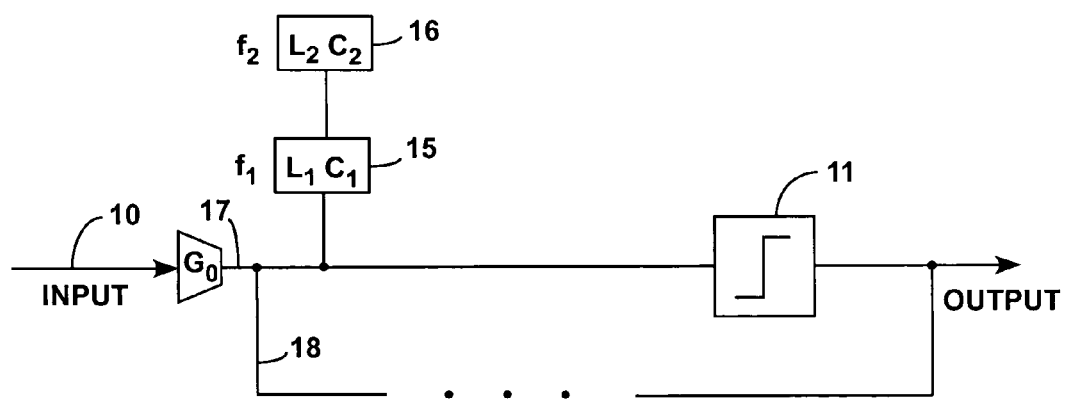
FIG. 4 shows a schematic representation of a first embodiment of the present disclosure.

The present disclosure improves the circuital arrangement discussed above because it provides for a fourth or higher order delta-sigma modulator by directly connecting the LC resonators in series so that the output of the first resonator is directly connected to the input of the second resonator, as shown in FIG. 4. According to FIG. 4, the second resonator 16 is placed upstream of the transconductor G0 and in series with the resonator 15.

The transfer function for the embodiment shown in FIG. 4 is as follows.

$$H(s) = G_0\left(\frac{sL_1}{s^2L_1C_1+1} + \frac{sL_2}{s^2L_2C_2+1}\right)$$

$$= G_0\frac{sL_1(s^2L_2C_2+1)+sL_2(s^2L_1C_1+1)}{(s^2L_1C_1+1)(s^2L_2C_2+1)}$$

Equation (3)

Figure 1:
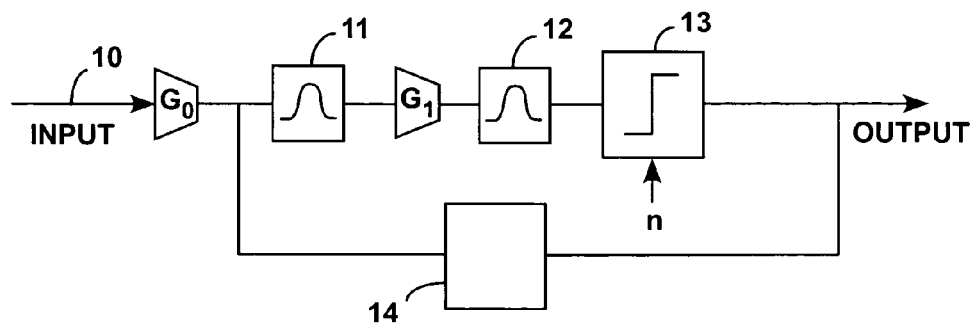
FIGS. 1 and 2, already discussed above, show schematic representations of a prior art delta-sigma modulator.
Figure 2:
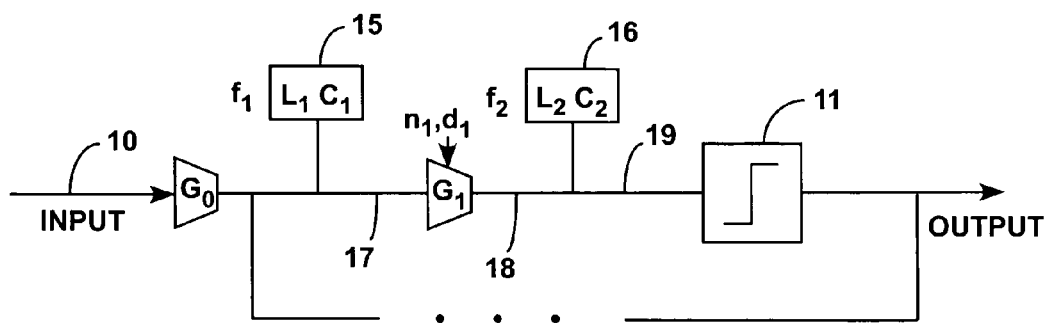
Figure 3:
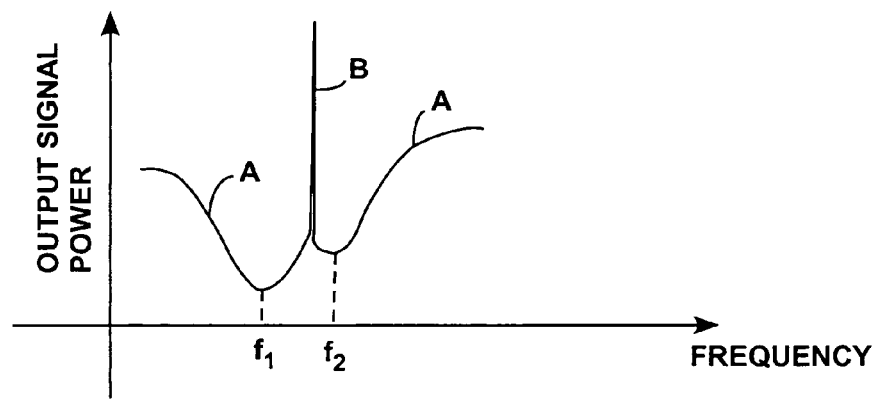
FIG. 3, already discussed above, shows a frequency spectrum related to the delta-sigma modulator of FIGS. 1 and 2.

It should be noted that the poles in Equation (3) are the same as in Equation (1). Therefore, it is possible to design a delta-sigma modulator with the same noise transfer function in either the configuration of FIG. 2 or FIG. 4. However, differently from the configuration of the prior art, the configuration according to the present disclosure does not need a transconductor G1.

With reference to FIG. 4, the input to the resonators 15 and 16 is the sum of the current signals 17 (output of the transconductor G0) and 18 (feedback loop). The quantizer 11 reads a voltage input V, which equals to the sum I of the current signals 17 and 18 times the impedance Z of the resonators 15 and 16.

Figure 5:
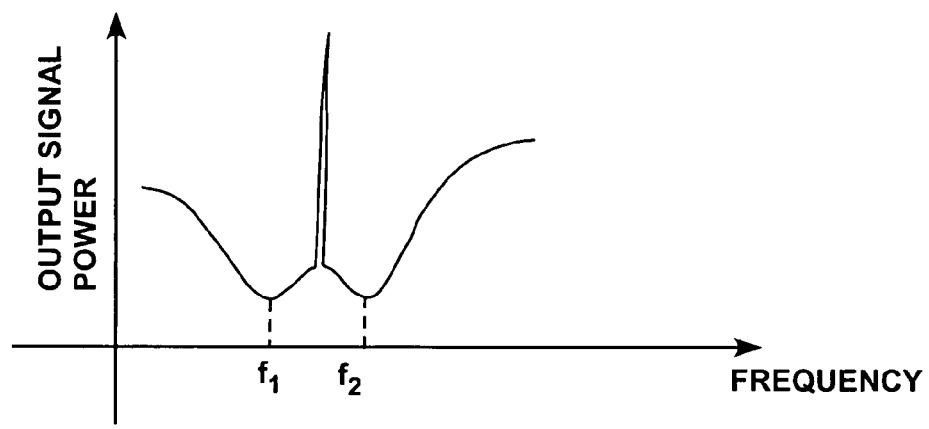
FIG. 5 shows a frequency spectrum related to the delta-sigma modulator of FIG. 4.

FIG. 5 shows the spectrum of the output signal power in accordance with the present disclosure, where the noise floor at the resonant frequency f1 is the same as the noise floor at the resonant frequency f2. The resonant frequencies can be anywhere from 0 to Fs/2, wherein Fs is the sampling frequency of the delta-sigma modulator.

The elimination of active components such as the transconductor G1, and further transconductors in case of a sixth-order, eighth-order, etc. delta-sigma modulator, increases linearity and decreases noise, particularly in applications with lower oversampling ratios, for example applications where the oversampling ratio is less than 400.

Figure 6:
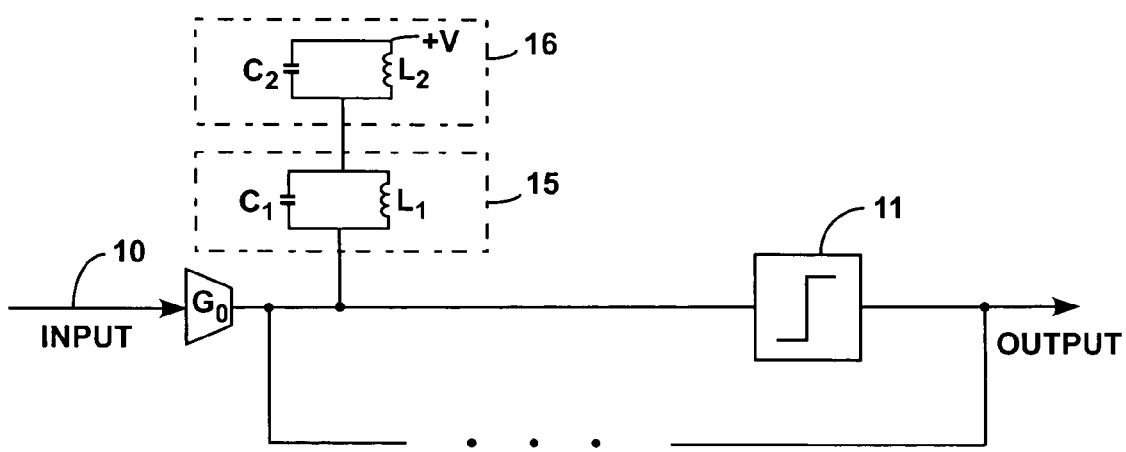
FIG. 6 shows a schematic representation of a second embodiment of the present disclosure.

FIG. 6 shows a further embodiment of the present disclosure, where both the first resonator 15 and the second resonator 16 are parallel LC resonators. Also in this embodiment, the first resonator is directly connected to the second resonator.

The present disclosure shows an embodiment dealing with a fourth-order modulator. The person skilled in the art will note that also sixth-order, eighth-order, and so on delta-sigma modulators can be provided, by just adding additional LC resonators in series to the two resonators shown in FIGS. 4 and 6. In those higher-order embodiments, at least two resonators, and preferably all resonators, will be directly connected to each other, similarly to what shown in FIGS. 4 and 6.

Figure 7:
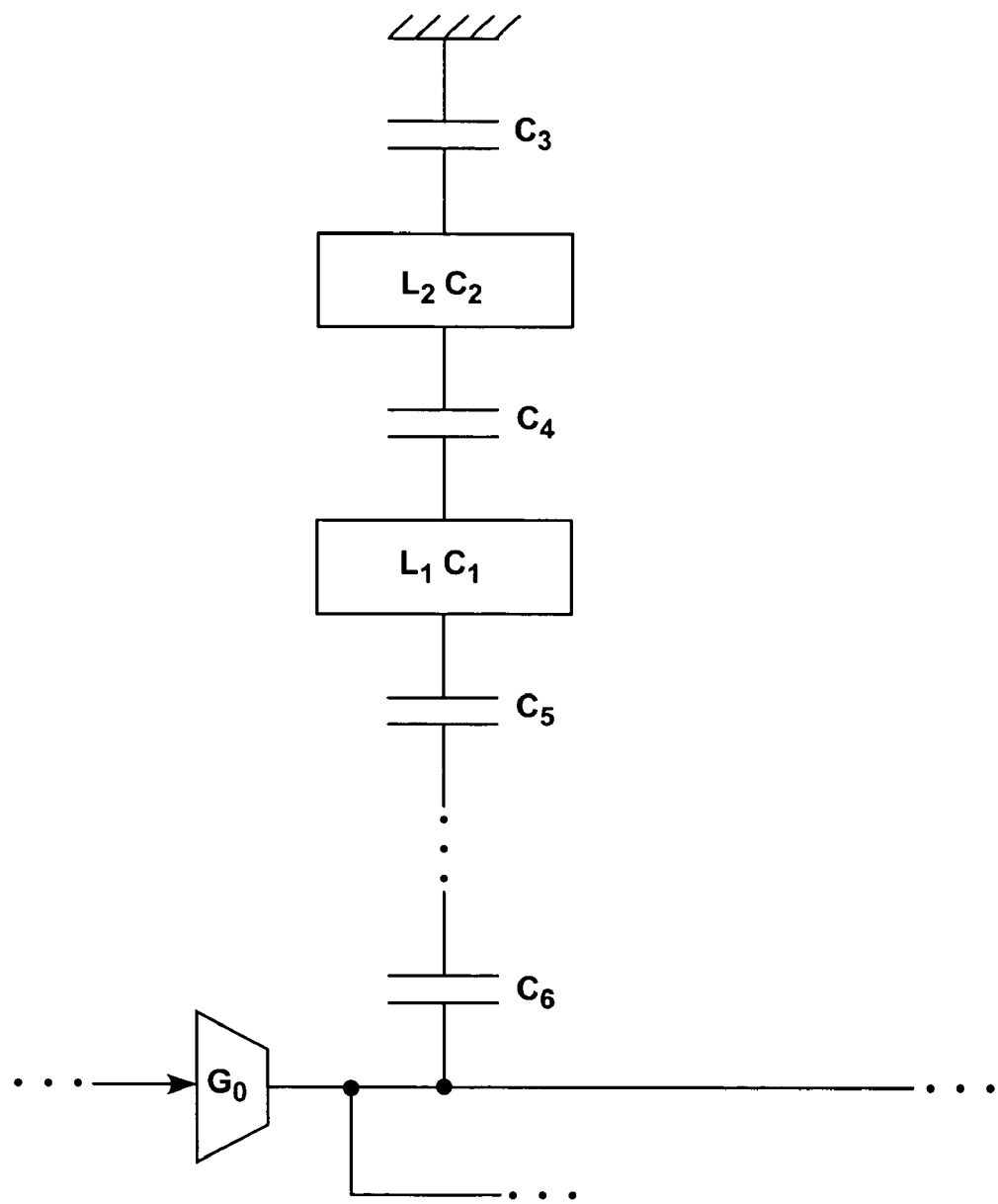
FIG. 7 shows a further embodiment for a lowpass delta-sigma modulator.

Additionally, a further embodiment for a lowpass delta-sigma modulator is possible where one or more LC resonators are directly connected in series with one or more capacitors, as shown in FIG. 7 which shows, by way of example, a series C3-L2C2-C4-L1C1-C5-C6. By doing this, the transfer function has at least one pole at DC and also one or more poles at higher frequencies. This embodiment can give a desirable noise transfer function for lowpass delta-sigma modulators.

It will be appreciated that the present disclosure is not limited to what has been particularly shown and described herein above. Rather the scope of the present disclosure is defined by the claims which follow.

What is claimed is:

1. A bandpass continuous-time delta-sigma modulator comprising:

a transconductor, having a voltage analog input and a current analog output;

a filtering arrangement, having a current input comprising, at least in part, the current analog output of the transconductor and a voltage analog output; and a quantizer having an input formed by the voltage analog output of the filtering arrangement, wherein the filtering arrangement comprises a first second-order resonator and a second second-order resonator directly connected in series with the first second-order resonator.

2. The delta-sigma modulator of claim 1, wherein the first second-order resonator and the second second-order resonator are LC parallel resonators.

3. The delta-sigma modulator of claim 1, wherein the first second-order resonator has an output and the second second-order resonator has an input, the output of the first second-order resonator forming the input of the second second-order resonator.

4. The delta-sigma modulator of claim 1, wherein the first second-order resonator has a first resonant frequency and the second second-order resonator has a second resonant frequency, the first and second resonant frequency being between 0 and Fs/2, Fs being a sampling frequency of the delta-sigma modulator.

5. A bandpass continuous-time delta-sigma modulator comprising:

an input circuit transforming a first analog voltage signal into a first analog current signal;

a filtering circuit comprising a first LC resonator and a second LC resonator directly connected with the first LC resonator; and an analog-to-digital converter connected with the filtering circuit, wherein:

a second analog current signal is input into the filtering circuit, the second analog current signal being formed, at least in part, by the first analog current signal; and a second analog voltage signal is input into the analog-to-digital converter, the second analog voltage being read out from the filtering circuit.

6. The delta-sigma modulator of claim 5, wherein the first LC resonator and the second LC resonator are LC parallel resonators.

7. The delta-sigma modulator of claim 5, wherein the first LC resonator has an output and the second LC resonator has an input, the output of the first LC resonator is directly connected to the input of the second LC resonator.

8. A bandpass continuous-time delta-sigma modulator comprising:

a filtering arrangement having a current analog input and a voltage analog output: and a quantizer having an input formed by the voltage analog output of the filtering arrangement, wherein the filtering arrangement comprises three or more second-order resonators, at least two of the three or more second-order resonators being directly connected to each other.

9. The bandpass continuous time delta-sigma modulator of claim 8, wherein all of the three or more second-order resonators are directly connected to each other.

10. The bandpass continuous time delta-sigma modulator of claim 8, wherein at least one second-order resonator has an output and another second-order resonator has an input, the output of the at least one second-order resonator is directly connected to the input of the another second-order resonator.

11. A method to convert an analog voltage signal to a digital voltage signal comprising:

providing a first analog voltage signal;

converting the first analog voltage signal to a first analog current signal; adding the first analog current signal to a second analog current signal to form a third analog current signal;

providing the third analog current signal to an analog filtering circuit comprising a first LC resonator and a second LC resonator in series with the first LC resonator to generate a second analog voltage signal, wherein an output of the first LC resonator forms an input of the second LC resonator; and quantizing the second analog voltage signal to generate the digital voltage signal.

12. The method of claim 11, wherein the first LC resonator and the second LC resonator are LC parallel resonators.

13. The method of claim 11, further comprising:

converting the digital voltage signal to a third analog voltage signal; and converting the third analog voltage signal to the second analog current signal.

14. The method of claim 11, wherein the first LC resonator has an output and the second LC resonator has an input, the output of the first LC resonator is directly connected to the input of the second LC resonator.

15. A lowpass continuous-time delta-sigma modulator comprising:

a transconductor, having a voltage analog input and a current analog output;

a filtering arrangement, having a current input comprising, at least in part, the current analog output of the trans conductor and a voltage analog output; and a quantizer having an input formed by the voltage analog output of the filtering arrangement, wherein the filtering arrangement comprises at least one second-order resonator directly connected with at least one capacitor.

16. The lowpass delta-sigma modulator of claim 15, wherein the filtering arrangement comprises a first second-order resonator, a second second-order resonator, and a capacitor directly connected to said first and second second-order resonator.

17. The lowpass delta-sigma modulator of claim 15, wherein the at least one second-order resonator has an output and the at least one capacitor has an input, wherein at least a portion the output of the at least one second-order resonator is provided to the input of the at least one capacitor.

18. The lowpass delta-sigma modulator of claim 15, wherein the at least one capacitor has an output and the at least one second-order resonator has an input, wherein at least a portion the output of the at least one capacitor is provided to the input of the at least one second-order resonator.

* * * * *